(12) United States Patent
Kim

(10) Patent No.: US 8,866,378 B2
(45) Date of Patent: Oct. 21, 2014

(54) ORGANIC LIGHT EMITTING DISPLAY AND METHOD OF MANUFACTURING THE SAME

(75) Inventor: Eun-Ah Kim, Yongin (KR)

(73) Assignee: Samsung Display Co., Ltd., Giheung-Gu, Yongin, Gyeonggi-Do (KR)

(*) Notice: Subject to any disclaimer, the term of this patent is extended or adjusted under 35 U.S.C. 154(b) by 176 days.

(21) Appl. No.: 13/041,586

(22) Filed: Mar. 7, 2011

(65) Prior Publication Data
US 2011/0221333 A1 Sep. 15, 2011

(30) Foreign Application Priority Data
Mar. 11, 2010 (KR) ........................ 10-2010-0021873

(51) Int. Cl.
H01L 51/50 (2006.01)
H01L 51/52 (2006.01)

(52) U.S. Cl.
CPC .................................. H01L 51/524 (2013.01)
USPC .......................................................... 313/504

(58) Field of Classification Search
CPC .................................................... H01L 51/524
USPC ........................................................... 313/504
See application file for complete search history.

(56) References Cited

U.S. PATENT DOCUMENTS

| | | | |
|---|---|---|---|
| 5,580,619 A | 12/1996 | Sakai et al. | |
| 6,825,612 B2 * | 11/2004 | Lai | 313/512 |
| 2002/0155320 A1 * | 10/2002 | Park et al. | 428/690 |
| 2005/0116636 A1 * | 6/2005 | Kang | 313/512 |
| 2005/0155704 A1 | 7/2005 | Yokajty et al. | |
| 2006/0001041 A1 * | 1/2006 | Peng | 257/103 |
| 2007/0170849 A1 | 7/2007 | Park | |
| 2009/0167155 A1 | 7/2009 | Kwak | |
| 2010/0149078 A1 * | 6/2010 | Kim et al. | 345/80 |
| 2011/0012506 A1 * | 1/2011 | Seo et al. | 313/504 |

FOREIGN PATENT DOCUMENTS

| | | |
|---|---|---|
| JP | 2001-76866 A | 3/2001 |
| KR | 0184232 | 12/1998 |
| KR | 100712177 B1 | 4/2007 |
| KR | 10-0732032 | 6/2007 |
| KR | 100733880 B1 | 6/2007 |
| KR | 1020080087257 A | 10/2008 |
| TW | I248773 * | 2/2006 |
| WO | WO 2008132671 A2 * | 11/2008 |

OTHER PUBLICATIONS

The Korean Office Action issued by Korean Patent Office on Jun. 29, 2011, corresponding to KR 10-2010-0021873 and Request for Entry attached herewith.
Korean Office action issued by KIPO on Nov. 30, 2011, corresponding to Korean Patent Application No. 10-2010-0021873 and Request for Entry attached herewith.

* cited by examiner

Primary Examiner — Anh Mai
Assistant Examiner — Hana Featherly
(74) Attorney, Agent, or Firm — Robert E. Bushnell, Esq.

(57) ABSTRACT

An organic light emitting display less damaged by shock and a method of manufacturing the same. The organic light emitting display includes a first substrate in which a pixel unit is formed so that the pixel unit is divided into an emission unit and a non-emission unit formed around the emission unit, a second substrate positioned to face the first substrate, and a sealing material formed on the non-emission unit of the first substrate to seal up the first substrate and the second substrate. Grooves are formed in at least one substrate of the first substrate and the second substrate between the sealing material and the emission unit.

20 Claims, 3 Drawing Sheets

ORGANIC LIGHT EMITTING DISPLAY AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on Mar. 11, 2010 and there duly assigned Serial No. 10-2010-0021873.

BACKGROUND OF THE INVENTION

1. Field of the Invention

The general inventive concept relates to an organic light emitting display and a method of manufacturing the same.

2. Description of the Related Art

In a flat panel display (FPD), a number of pixels are arranged on a substrate in a matrix to obtain a display region. Scan lines and data lines are coupled to the respective pixels so that data signals are selectively applied to the pixels displaying an image.

The FPD is divided into a passive matrix type light emitting display and an active matrix type light emitting display in accordance with a method of driving the pixels. The active matrix type light emitting display unit in which unit pixels are selected and illuminated in terms of resolution, contrast, and operation speed is mainly used.

The FPDs are used as the displays for portable information terminals such as a personal computer, a mobile telephone, and a personal digital assistant (PDA) or the monitors of various information apparatuses. A liquid crystal display (LCD) using a liquid crystal panel, an organic light emitting display in which organic light emitting diodes (OLED) are used, and a plasma display panel (PDP) in which a plasma panel is used are well known as the FPD.

Recently, various light emitting displays having smaller weight and volume than the weight and volume of a cathode ray tube (CRT) are developed. In particular, the organic light emitting display having high emission efficiency and brightness and a large view angle is spotlighted.

Among the FPDs, the organic light emitting display displays an image using the OLEDs including organic layers for generating light by re-combination of electrons and holes generated to correspond to the flow of current.

The organic light emitting display is widespread in the market as a personal digital assistant (PDA) and an MP3 player other than a mobile telephone in an application field due to various advantages such as excellent color reproducibility and small thickness.

The above information disclosed in this Related Art section is only for enhancement of understanding of the background of the invention and therefore it may contain information that does not form the prior art that is already known to a person of ordinary skill in the art.

SUMMARY OF THE INVENTION

Aspects of the present invention provide for an organic light emitting display less damaged by shock and a method of manufacturing the same.

In order to achieve the foregoing and/or other aspects of the present invention, according to a first aspect of the present invention, an organic light emitting display includes a first substrate in which a pixel unit is formed so that the pixel unit is divided into an emission unit and a non-emission unit formed around the emission unit, a second substrate positioned to face the first substrate, and a sealing material formed on the non-emission unit of the first substrate to seal up the first substrate and the second substrate. Grooves may be formed in at least one substrate of the first substrate and the second substrate between the sealing material and the emission unit.

Also, the grooves may be formed in both surfaces of the first substrate and the second substrate.

According to a second aspect of the present invention, a method of manufacturing an organic light emitting display includes forming grooves on outlines of a first substrate and a second substrate, forming a pixel unit in the first substrate, forming a sealing material outside the outlines of the first substrate and the second substrate, and positioning the first substrate and the second substrate to face each other and sealing up the first substrate and the second substrate using the sealing material.

The grooves may be formed on both surfaces of the first substrate and the second substrate.

In a flat panel display (FPD) according to the present invention and a method of manufacturing the same, although shock is applied to the organic light emitting display, it is possible to prevent a crack or cracks from being generated in the substrates.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
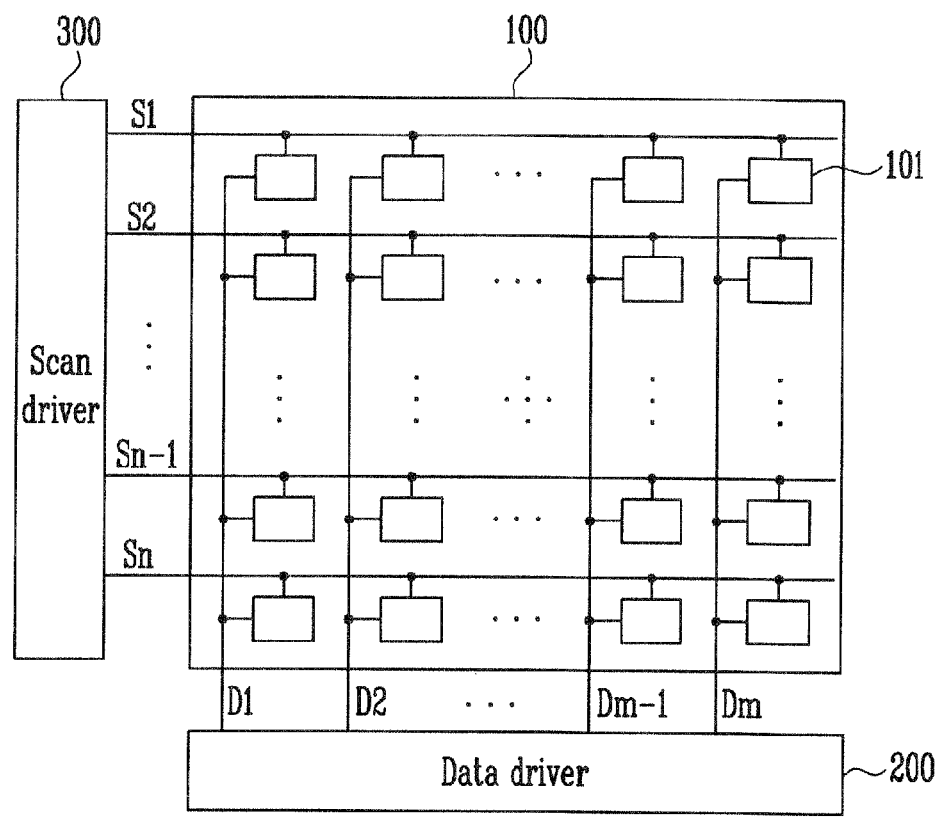
FIG. 1 is block diagram illustrating the structure of an organic light emitting display according to the present invention.

Hereinafter, certain exemplary embodiments according to the present invention will be described with reference to the accompanying drawings. Here, when a first element is described as being coupled to a second element, the first element may be not only directly coupled to the second element but may also be indirectly coupled to the second element via a third element. Further, some of the elements that are not essential to the complete understanding of the invention are omitted for clarity. Also, like reference numerals refer to like elements throughout. As those skilled in the art would realize, the described embodiments may be modified in various different ways, all without departing from the spirit or scope of the principles for the present invention.

Recognizing that sizes and thicknesses of constituent members shown in the accompanying drawings are arbitrarily given for better understanding and ease of description, the present invention is not limited to the illustrated sizes and thicknesses.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. Alternatively, when an element is referred to as being "directly on" another element, there are no intervening elements present.

In order to clarify the present invention, elements extrinsic to the description are omitted from the details of this description, and like reference numerals refer to like elements throughout the specification.

Hereinafter, the embodiments of the present invention will be described in detail with reference to the accompanying drawings.

In a conventional organic light emitting display, transistors and OLEDs are formed on a first substrate and sealing is performed using a second substrate formed on the first substrate. When sealing is performed using the second substrate, a sealing material is used. Then, a shock test is performed.

When the first substrate is sealed by the second substrate using the sealing material, the sealing material is formed on the outlines of the first substrate and the second substrate. When the shock test on the sealed organic light emitting display is performed, the part in which the sealing material exists is fixed by the sealing material and the center in which the sealing material is not formed is not fixed. Therefore, when shock is applied, vibration is generated so that the first substrate and the second substrate are curved by the vibration. When the degree of curvature is large, a crack or cracks are generated. Therefore, when shock is applied by the shock test, the resulting cracks formed cause yield to deteriorate.

FIG. 1 is block diagram illustrating the structure of an organic light emitting display according to the present invention.

Referring to FIG. 1, the organic light emitting display includes a pixel unit 100, a data driver 200, and a scan driver 300.

In the pixel unit 100, a plurality of pixels 101 are arranged. The pixels 101 include organic light emitting diodes (not shown) that emit light to correspond to the flow of current. In the pixel unit 100, n scan lines S1, S2, . . . Sn−1, and Sn formed in a row direction to transmit scan signals and m data lines D1, D2, . . . Dm−1, and Dm formed in a column direction to transmit data signals are arranged.

The pixel unit 100 receives a first voltage ELVDD and a second voltage ELVSS to be driven. Therefore, in the pixel unit 100, current flows through the OLEDs by the scan signals, the data signals, the first voltage ELVDD, and the second voltage ELVSS so that light is emitted and that an image is displayed.

The pixel unit 100 is divided into an emission region and a non-emission region and grooves are formed between the non-emission region and the emission region.

The scan driver 300 for generating the scan signals transmits a scan signal to a specific row of the pixel unit 100 through a scan line. A data signal output from the data driver 200 is transmitted to a pixel 101 to which a scan signal is transmitted so that the voltage corresponding to the data signal is transmitted to the pixel 101.

The data driver 200 generates the data signals using image signals R, G, and B data having red, blue, and green components. The data signal is transmitted to the pixel selected by the scan signal so that the light corresponding to the data signal is emitted by the pixel.

Figure 2:
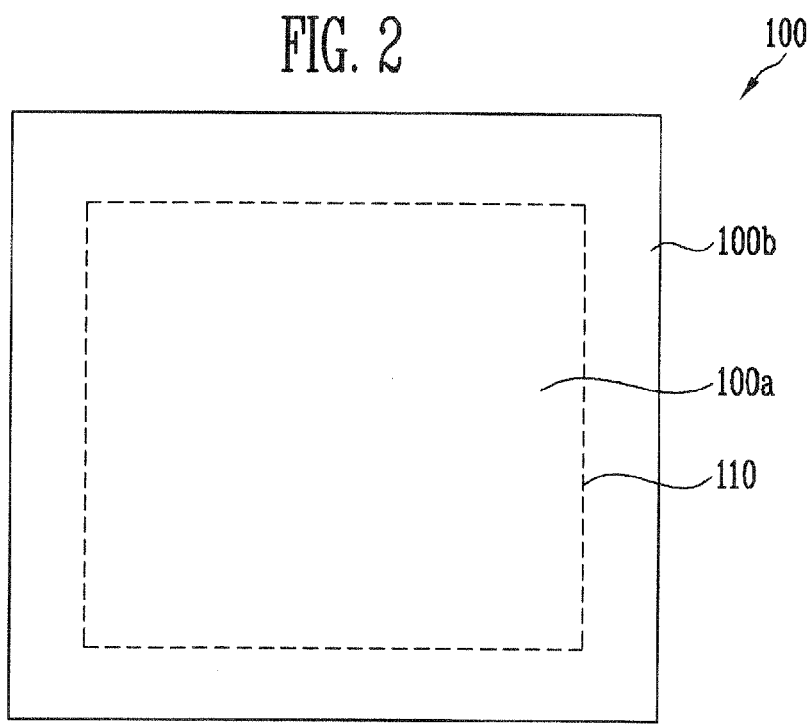
FIG. 2 is a plan view illustrating the organic light emitting display according to the present invention.

FIG. 2 is a plan view illustrating the organic light emitting display according to the present invention.

Referring to FIG. 2, the organic light emitting display includes an emission region 100a and a non-emission region 100b. The organic light emitting display is divided into a first substrate (shown in later Figures) and a second substrate (shown in later Figures). The first substrate and the second substrate are sealed up by a sealing material (shown in later Figures).

The emission region 100a is positioned in the center of the first substrate and the non-emission region 100b is formed around and entirely surrounding the emission region 100a. A pixel is formed in the emission region 100a and a dummy pixel and a scan driver are formed in the non-emission region 100b. Grooves 110 are formed on the boundary between the non-emission region 100b and the emission region 100a and the sealing material is coated outside the groove 110. The grooves 110 may take the shape, but not limited thereto, of a square or a rectangle depending on the shape of the emission region 100a and the non-emission region 100b.

Figure 3A:
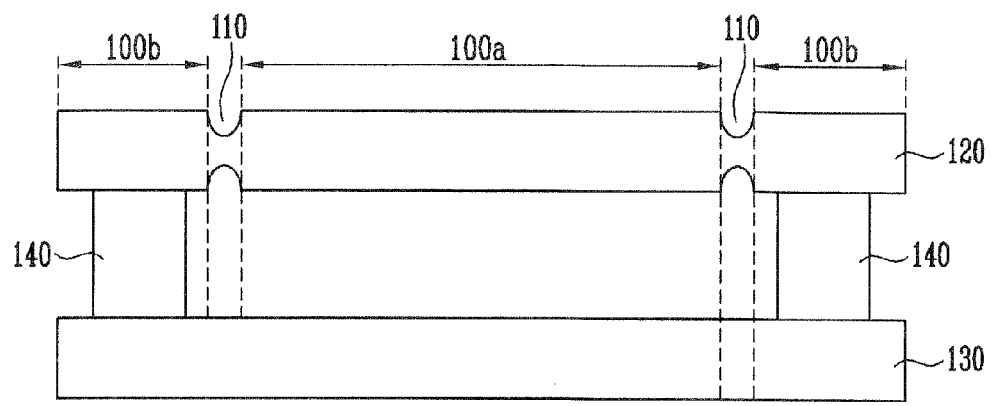
FIG. 3A is a sectional view illustrating a first embodiment of the organic light emitting display according to the present invention.
Figure 3B:
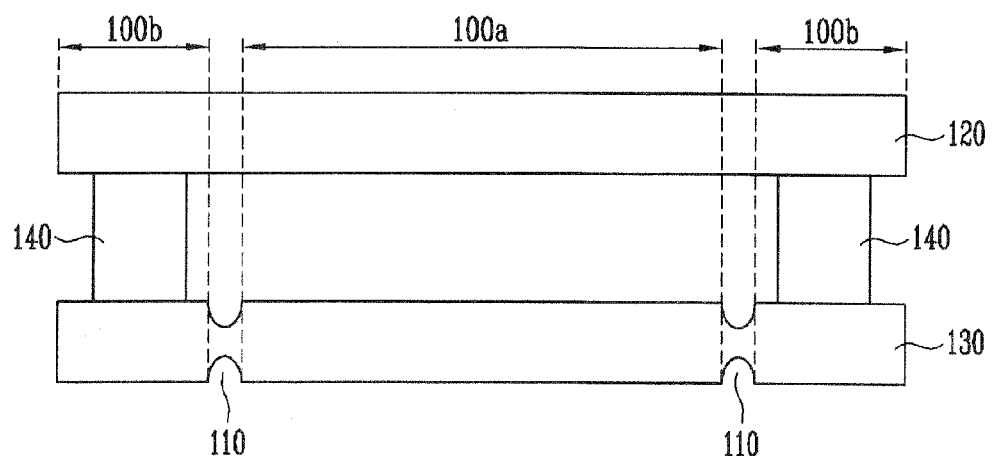
FIG. 3B is a sectional view illustrating a second embodiment of the organic light emitting display according to the present invention.
Figure 3C:
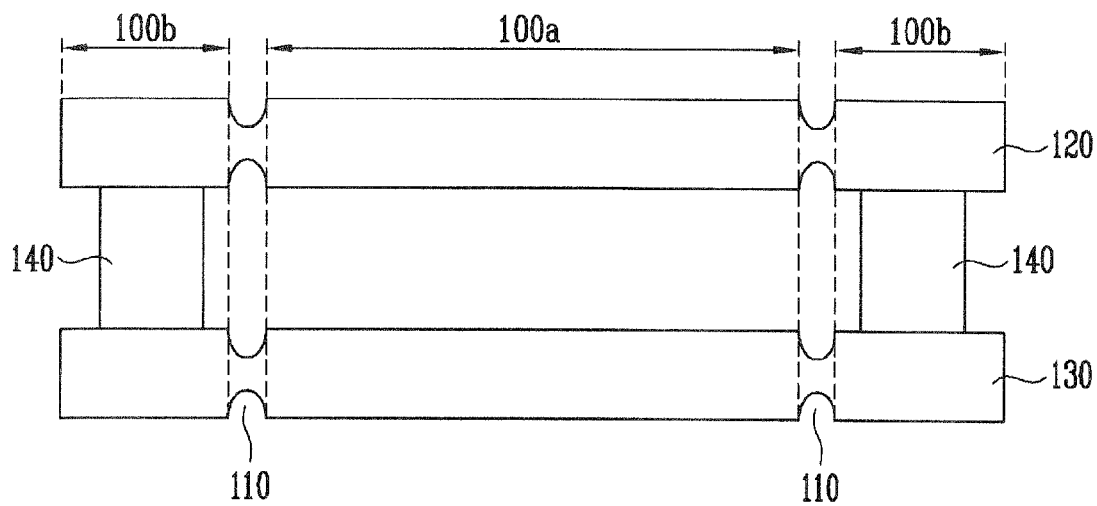
FIG. 3C is a sectional view illustrating a third embodiment of the organic light emitting display according to the present invention.
Figure 3D:
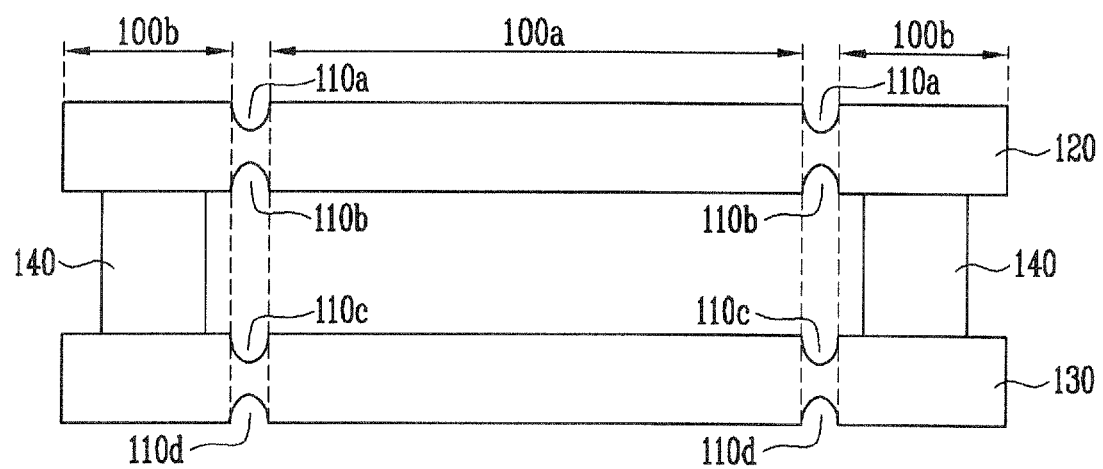
FIG. 3D is a sectional view illustrating further details of the grooves 110 illustrated in FIG. 2 and FIGS. 3A-3C.

FIG. 3A is a sectional view illustrating a first embodiment of the organic light emitting display according to the present invention, FIG. 3B is a sectional view illustrating a second embodiment of the organic light emitting display according to the present invention, and FIG. 3C is a sectional view illustrating a third embodiment of the organic light emitting display according to the present invention. FIG. 3D is a sectional view illustrating further details of the grooves 110 illustrated in FIG. 2 and FIGS. 3A-3C.

Referring to FIGS. 3A to 3D, in the organic light emitting display, a first substrate 130 and a second substrate 120 face each other and the first substrate 130 and the second substrate 120 are sealed up by a sealing material 140. The grooves 110 are formed inside a part where the sealing material 140 is formed.

The grooves 110 may be formed only in the second substrate 120 as illustrated in FIG. 3A and may be formed only in the first substrate 130 as illustrated in FIG. 3B. As illustrated in FIG. 3C, the grooves 110 may be formed in the first substrate 130 and the second substrate 120. FIG. 3D illustrates the grooves 110, shown in FIG. 3A having groove portions that include a first groove portion 110a and a second groove portion 110b, FIG. 3D further illustrates the grooves 110, shown in FIG. 3B having groove portions that include a third groove portion 110c and a fourth groove portion 110d, Still further, FIG. 3D illustrates the grooves 110, shown in FIG. 3C having groove portions that include a first groove portion 110a, a second groove portion 110b, a third groove portion 110c and a fourth groove portion 110d, These grooves 110 may take various shapes including, but not limited to, semicircular, conical, concave, square, rectangular or U shaped.

When the first substrate 130 and the second substrate 120 are sealed by the sealing material 140, the part that contacts the sealing material 140, that is, the non-emission region 100b is firmly fixed to the sealing material although so that when shock is applied to the first substrate 130 and the second substrate 120 so that vibration is not generated. When shock is applied to the part that does not contact the sealing material, that is, the emission region 100a, a space is generated between the first substrate 130 and the second substrate 120 so that vibration is generated in the emission region 100a. Since the area where the grooves 110 are formed is thin of the first substrate 130 and the second substrate 120, the part is stronger and able to withstand shock. Therefore, it is possible to prevent cracks from being generated in the first substrate 130 and/or the second substrate 120 by the grooves 110 around and/or immediately adjacent to the sealing material 140.

FIG. 3D illustrates and further details the grooves 110, illustrated in FIG. 2 and FIGS. 3A-3C. As previously discussed, FIG. 3D illustrates the grooves 110, shown in FIG. 3A having groove portions that include a first groove portion 110a and a second groove portion 110b, FIG. 3D further illustrates the grooves 110, shown in FIG. 3B having groove portions that include a third groove portion 110c and a fourth groove portion 110d, Still further, FIG. 3D illustrates the grooves 110, shown in FIG. 3C having groove portions that include a first groove portion 110a, a second groove portion 110b, a third groove portion 110c and a fourth groove portion 110d, It should be noted, as illustrated in FIG. 3D, second groove portion 110b is on a side of second substrate 120 facing first substrate 130 and first groove portion 110a is on the opposite side of second substrate 120 to that of second groove portion 110b. Further, first groove portion 110a may be in-line with and directly opposite to second groove portion 110b. This also applies to third grove portion 110c and fourth 110d in which, as illustrated in FIG. 3D, third groove portion 110c is on a side of first substrate 130 facing second substrate 130 and fourth groove portion 110d is on the opposite side of first substrate 130 to that of third groove portion 110c. Further, third groove portion 110c may be in-line with and directly opposite to fourth groove portion 110d. In addition, as illustrated in FIG. 3D, first groove portion 110a, second groove portion 110b, third groove portion 110c and fourth groove portion 110d may all be positioned in a straight line and geometric planes and with one another. As previously discussed, grooves 110 and specifically these groove portions 110a-110d may take various shapes including, but not limited to, semicircular, conical, concave, square, rectangular or U shaped.

Therefore, although shock is applied to the organic light emitting display due to the shock test, the ability to withstand the shock is substantially increased.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display, comprising:
   a first substrate including an emission unit in which a pixel unit is formed and a non-emission unit outside the emission unit;
   a second substrate positioned to face the first substrate; and
   a sealing material formed between the first substrate and the second substrate of the non-emission unit to seal the emission unit,
   wherein grooves are formed in at least one substrate of the first substrate and the second substrate between the sealing material and the emission unit, an entirety of the sealing material is spaced apart from the grooves.

2. The organic light emitting display as claimed in claim 1, wherein the grooves are formed in both surfaces of the first substrate and the second substrate.

3. The organic light emitting display as claimed in claim 1, wherein the sealing material entirely surrounds the emission unit.

4. The organic light emitting display as claimed in claim 3, wherein the sealing material is in the shape of a square or a rectangle.

5. The organic light emitting display as claimed in claim 3, wherein the grooves entirely surrounds the emission unit and are adjacent to the sealing material.

6. The organic light emitting display as claimed in claim 5, wherein the grooves are semicircular, conical, concave, square, rectangular or U shaped.

7. The organic light emitting display as claimed in claim 1, wherein the grooves further comprise:
   a first groove portion is on a surface of the first substrate; and
   a second groove portion is on an opposite surface of the first substrate to that of the first groove portion,
   wherein the first groove portion is in-line with the second groove portion.

8. The organic light emitting display as claimed in claim 7, wherein the grooves further comprises:
   a third groove portion is on a surface of the second substrate; and
   a fourth groove portion is on an opposite surface of the second substrate to that of the third groove portion,
   wherein the third groove portion is in-line with the second groove portion.

9. The organic light emitting display as claimed in claim 1, wherein the grooves further comprise:
   a first groove portion is on a surface of the first substrate;
   a second groove portion is on an opposite surface of the first substrate to that of the first groove portion,
   a third groove portion is on a surface of the second substrate; and
   a fourth groove portion is on an opposite surface of the second substrate to that of the third groove portion,
   wherein the first, second, third and fourth groove portions are in-line with each other.

10. A method of manufacturing an organic light emitting display, comprising:
    providing a first substrate including an emission unit in which a pixel unit is formed and a non-emission unit outside the emission unit;
    providing a second substrate;
    forming grooves on at least one substrate of the first substrate and the second substrate of the non-emission unit;
    forming a pixel unit in the emission unit of the first substrate;
    forming a sealing material on the non-emission unit of the second substrate; and
    positioning the first substrate and the second substrate to face each other to seal the emission unit by the sealing material,
    wherein said grooves positioned between the sealing material and the emission unit, an entirety of the sealing material is spaced apart from the grooves.

11. The method as claimed in claim 10, wherein the grooves are formed on both surfaces of the first substrate and the second substrate.

12. The organic light emitting display as claimed in claim 10, wherein the sealing material entirely surrounds the emission unit.

13. The organic light emitting display as claimed in claim 12, wherein the sealing material is in the shape of a square or a rectangle.

14. The organic light emitting display as claimed in claim 12, wherein the grooves entirely surround the emission unit and are adjacent to the sealing material.

15. The organic light emitting display as claimed in claim 14, wherein the grooves are semicircular, conical, concave, square, rectangular or U shaped.

16. The organic light emitting display as claimed in claim 10, wherein the grooves further comprise:
   a first groove portion on a surface of the first substrate; and
   a second groove portion on an opposite surface of the first substrate,
   wherein the first groove portion is in-line with the second groove portion.

17. The organic light emitting display as claimed in claim 16, wherein the grooves further comprise:
   a third groove portion on a surface of the first substrate; and
   a fourth groove portion on an opposite surface of the first substrate to that of the third groove portion,
   wherein the third groove portion is in-line with the fourth groove portion.

18. The organic light emitting display as claimed in claim 10, wherein the grooves further comprise:
   a first groove portion on a surface of the first substrate;
   a second groove portion on an opposite surface of the first substrate, a third groove portion on a surface of the first substrate; and
   a fourth groove portion on an opposite surface of the first substrate to that of the third groove portion,
   wherein the first, second, third and fourth groove portions are in-line with each other.

19. An organic light emitting display, comprising:
   a first substrate including an emission unit in which a pixel unit is formed and a non-emission unit formed outside the emission unit; and
   a sealing material formed between the first substrate and the second substrate of the non-emission unit to seal the emission unit,
   wherein grooves are formed in the first substrate between the sealing material and the emission unit, an entirety of the sealing material is spaced apart from the grooves.

20. The organic light emitting display of claim 19, the grooves are semicircular, conical, concave, square, rectangular or U shaped.

* * * * *